US008525072B2

(12) United States Patent
Nakai et al.

(10) Patent No.: US 8,525,072 B2
(45) Date of Patent: Sep. 3, 2013

(54) LASER SOLDERING APPARATUS

(75) Inventors: Izuru Nakai, Osaka (JP); Masahiro Mori, Osaka (JP); Yukio Nishikawa, Osaka (JP)

(73) Assignee: Panasonic Corporation, Osaka (JP)

( * ) Notice: Subject to any disclaimer, the term of this patent is extended or adjusted under 35 U.S.C. 154(b) by 486 days.

(21) Appl. No.: 12/706,976

(22) Filed: Feb. 17, 2010

(65) Prior Publication Data

US 2010/0206854 A1 Aug. 19, 2010

(30) Foreign Application Priority Data

Feb. 17, 2009 (JP) .................................. 2009-033773

(51) Int. Cl.
*B23K 1/005* (2006.01)

(52) U.S. Cl.
USPC ............. 219/121.65; 219/121.78; 219/121.83

(58) Field of Classification Search
USPC ............. 219/121.61–121.73, 121.83, 121.78; 228/103, 179.1–180.22; 438/108
See application file for complete search history.

(56) References Cited

U.S. PATENT DOCUMENTS

| | | | | |
|---|---|---|---|---|
| 4,694,139 A | * | 9/1987 | Roder | ....................... 219/121.78 |
| 4,899,924 A | | 2/1990 | Kawaguchi | |
| 5,500,502 A | * | 3/1996 | Horita et al. | ............. 219/121.63 |
| 6,394,158 B1 | | 5/2002 | Momeni | |
| 2001/0028535 A1 | * | 10/2001 | Wei et al. | ....................... 360/135 |
| 2005/0245917 A1 | * | 11/2005 | Strassl et al. | .................... 606/17 |

FOREIGN PATENT DOCUMENTS

| | | | |
|---|---|---|---|
| EP | 497260 A2 | * | 1/1992 |
| JP | 62004884 A | * | 1/1987 |
| JP | 62-165071 U | | 10/1987 |
| JP | 62-169769 U | | 10/1987 |
| JP | 62-275571 | | 11/1987 |
| JP | 62-282773 | | 12/1987 |
| JP | 63-160780 | | 7/1988 |
| JP | 3-198976 | | 8/1991 |
| JP | 4-26666 U | | 3/1992 |
| JP | 4-237557 | | 8/1992 |
| JP | 5-235538 | | 9/1993 |
| JP | 6-13746 | | 1/1994 |
| JP | 2001-523585 | | 11/2001 |
| JP | 2004-337894 | | 12/2004 |
| WO | WO9423887 | * | 10/1994 |

* cited by examiner

*Primary Examiner* — Samuel M Heinrich
(74) *Attorney, Agent, or Firm* — Hamre, Schumann, Mueller & Larson, P.C.

(57) ABSTRACT

By irradiating laser light 20 obliquely onto a substrate 6, the laser soldering apparatus reduces the laser light passing through an insertion hole 61*a* in the substrate 6 and prevents damage to low-heat-resistance portions of a component 62 disposed on the rear surface side of the substrate 6. Moreover, the substrate 6 can be observed from a normal direction with a camera 23. Therefore, even if the insertion hole 61 for inserting a component lead or the like is provided in the substrate 6, the laser light does not leak out to the side of a component mounting surface 17 of the substrate 6.

8 Claims, 10 Drawing Sheets

LASER SOLDERING APPARATUS

BACKGROUND OF THE INVENTION

1. Field of the Invention

The present invention relates to a laser soldering apparatus for applying heat to a soldering point by irradiation of a laser light beam, in soldering a component onto a substrate.

2. Description of the Background Art

Japanese Patent Application Publication No. 2004-337894 discloses correcting the spot diameter of a laser light beam at a soldering point by changing a distance between an optics system which irradiates the laser light beam and the soldering point.

FIG. 10 shows a conventional laser soldering apparatus of this kind.

As well as supplying solder 11a from a solder supply unit 11 to a soldering point P on a substrate 6, a light beam 15 is irradiated from a light source 1 onto the soldering point P.

The light beam emitted from the light source 1 is irradiated onto a half-mirror 3 by a first light path 2. The light beam transmitted through the half mirror 3 is irradiated onto the soldering point P on the substrate 6 via optical means 4 which shapes the light beam and collects light onto the substrate 6 and via a protective glass 5.

The light beam reflected at the soldering point P on the substrate 6 passes along a second light path 9 reflected by the half mirror 3, and is then incident on a photoreceptor unit 8 via a mirror 7.

A processing head 16 composed in this way is attached to drive means 10 via first movement means 12. By driving the drive means 10, it is possible to move the processing head 16 to the soldering point P on the substrate 6. The processing head 16 can be moved in the upward/downward direction (Z axis direction) with respect to the substrate 6 by the first movement means 12.

The solder supply unit 11 is attached to the light source 1 via second movement means 13 and third movement means 14. The second movement means 13 can move the solder supply unit 11 in the upward/downward direction (Z axis direction) with respect to the substrate 6. The third movement means 14 moves the solder supply unit 11 horizontally so as to locate a suitable supply position for the solder 11a.

In the conventional composition, since the light beam is irradiated from a perpendicular direction onto the substrate 6, then if a hole for inserting a component lead or the like is provided on the substrate 6, the laser light leaks out through this hole to the side of a component mounting surface 17 of the substrate 6. Thus, the laser light is irradiated onto the main body of a component disposed on the component mounting surface 17 of the substrate 6, thereby causing damage to the component.

Furthermore, if the laser light passing through the hole is reduced by providing an angle between the normal direction of the substrate 6 and the first light path 2 of the laser light emitted from the light source 1, then it is not possible to observe the base end of the lead portion of the component through the hole.

Moreover, since a distance between the optical means 4 and the substrate 6 is simply changed by the first movement means 12, then the shape of spot of the laser light beam collected on the substrate 6 only undergoes a uniform shape change. Therefore, although it is possible to perform spot soldering, if a plurality of sites are to be soldered consecutively, then the steps of supplying solder and melting the solder by the irradiation of the laser light have to be carried out respectively at processing points, and therefore productivity is low.

SUMMARY OF THE INVENTION

It is an object of the present invention to provide a laser soldering apparatus in which, even if a hole for inserting a component lead or the like is provided in the substrate 6, the laser light does not leak out to the side of the component mounting surface 17 of the substrate 6.

It is a further object of the present invention to provide a laser soldering apparatus in which, even if a hole for inserting a component lead or the like is provided in the substrate 6, the base end of the lead portion of a component can be passed through the hole.

It is a yet further object of the present invention to provide a laser soldering apparatus having favorable productivity such that a plurality of sites can be soldered consecutively with high efficiency, as well as spot soldering.

The laser soldering apparatus of the present invention is a laser soldering apparatus for soldering a component onto the soldering point on a substrate using laser light, including: a first mirror for reflecting the laser light emitted from a mirror tube in a direction intersecting with the central axis of the mirror tube; a second mirror for receiving the laser light from the first mirror and reflecting the laser light to a hole; and an optics system for condensing the laser light, the optics system being disposed between the first mirror and the second mirror, the apparatus being configured such that the laser light is irradiated from the second mirror onto the soldering point at an angle with respect to the axial direction of the mirror tube. More specifically, the angle of the irradiation of the laser light with respect to the vertical direction of the substrate at the soldering point is set to 11° to 76°.

Furthermore, the first mirror reflects the laser light from the mirror tube and transmits the light from the soldering point, and a camera for observing the soldering point on the substrate is disposed on the central axis of the mirror tube.

Moreover, solder is supplied from a solder supply unit to the soldering point so as to block the laser light irradiated from the second mirror.

Furthermore, the laser soldering apparatus further includes a rotational drive device for rotating an optics unit having the first mirror, the second mirror and the optics system about an axis linking the soldering point with the optical axis of the laser light incident on the first mirror.

Furthermore, the optics system is movably provided in the optical axis direction of the optics system, and the size of the irradiation spot of the laser light at the soldering point on the substrate can be changed.

Moreover, a lens lacking axial symmetry optically is disposed before or behind the optics system on the optical axis thereof to change the shape of the irradiation spot of the laser light at the soldering point on the substrate to an elliptical or linear shape.

Furthermore, the laser soldering apparatus further includes an infrared radiation temperature sensor for measuring the temperature of the soldering point, wherein the laser output of the light source of the laser light is controlled on the basis of a measurement result by the temperature sensor.

Moreover, the second mirror is covered with a coating for reflecting the laser light from the side of the first mirror and transmitting infrared rays necessary for temperature measurement, of the light reflected from the soldering point on the substrate, a temperature sensor is provided on the rear surface of the second mirror, and the laser output of the light source of the laser light is controlled on the basis of a measurement result by the temperature sensor.

With this composition, since the laser light is irradiated from an oblique direction onto the substrate, then even if an insertion hole for a component is formed on the substrate, it is possible to prevent the laser light from leaking out to a component mounting surface from the insertion hole, thereby preventing damage to soldered portions from being caused by the transmitted laser light.

Moreover, since the first mirror used is a mirror which reflects the laser light from the mirror tube and transmits the light from the soldering point, and since the camera is provided on the central axis of the mirror tube, then it is possible to observe an image captured in the vicinity of the base end of the lead of the component, from the vertical direction of the substrate.

By providing the rotational drive device for rotating the optics unit having the first mirror, the second mirror and the optics system about the axis linking the soldering point with the optical axis of the laser light incident on the first mirror, it is possible to achieve laser soldering with favorable productivity whereby a plurality of sites can be soldered efficiently in a consecutive fashion.

Furthermore, by providing the optics system movably in the optical axis direction of the optics system, the size of the irradiation spot of the laser light at the soldering point on the substrate can be changed.

Moreover, by disposing the lens lacking axial symmetry optically before or behind the optics system on the optical axis thereof, the shape of the irradiation spot of the laser light at the soldering point on the substrate can be changed to an elliptical or linear shape.

Furthermore, by providing the infrared radiation temperature sensor for measuring the temperature of the soldering point to control the laser output of the light source of the laser light on the basis of the measurement result by the temperature sensor, it is possible to achieve soldering of high quality at high speed.

DESCRIPTION OF THE PREFERRED EMBODIMENTS

Embodiments of the present invention are described below with reference FIG. 1 to FIG. 9.

(First Embodiment)

FIG. 1 to FIGS. 5A and 5B show a first embodiment of the present invention.

Figure 1:
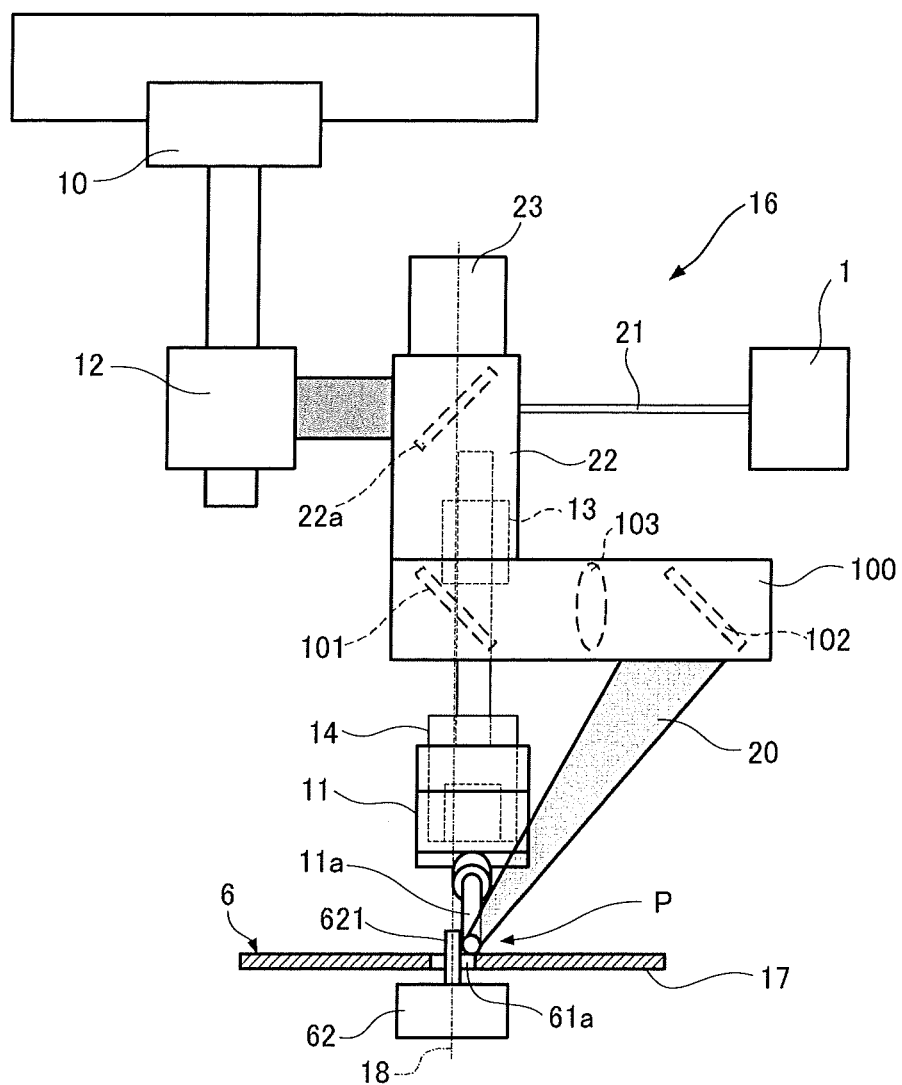
FIG. 1 is a configurational diagram schematically showing a laser soldering apparatus according to a first embodiment of the present invention.

FIG. 1 shows a laser soldering apparatus according to the first embodiment.

Solder 11a is supplied from a solder supply unit 11 to a soldering point P on a substrate 6, in addition to which laser light 20 is irradiated at an irradiation angle of 11° to 76° with respect to the perpendicular direction onto the soldering point P.

At the soldering point P on the substrate 6, a flat insertion pin 621 serving as the lead of a component 62 is inserted into an insertion hole 61a formed on the substrate 6 from the side of a component mounting surface 17, and a through hole land 611 is formed about the insertion hole 61a as shown in FIG. 3A. Here, a material with low heat resistance, such as resin, is used for the component 62. The component 62 having low heat resistance is a component having a lower heat resistance limit than the melting point of the solder 11a.

Figure 2:
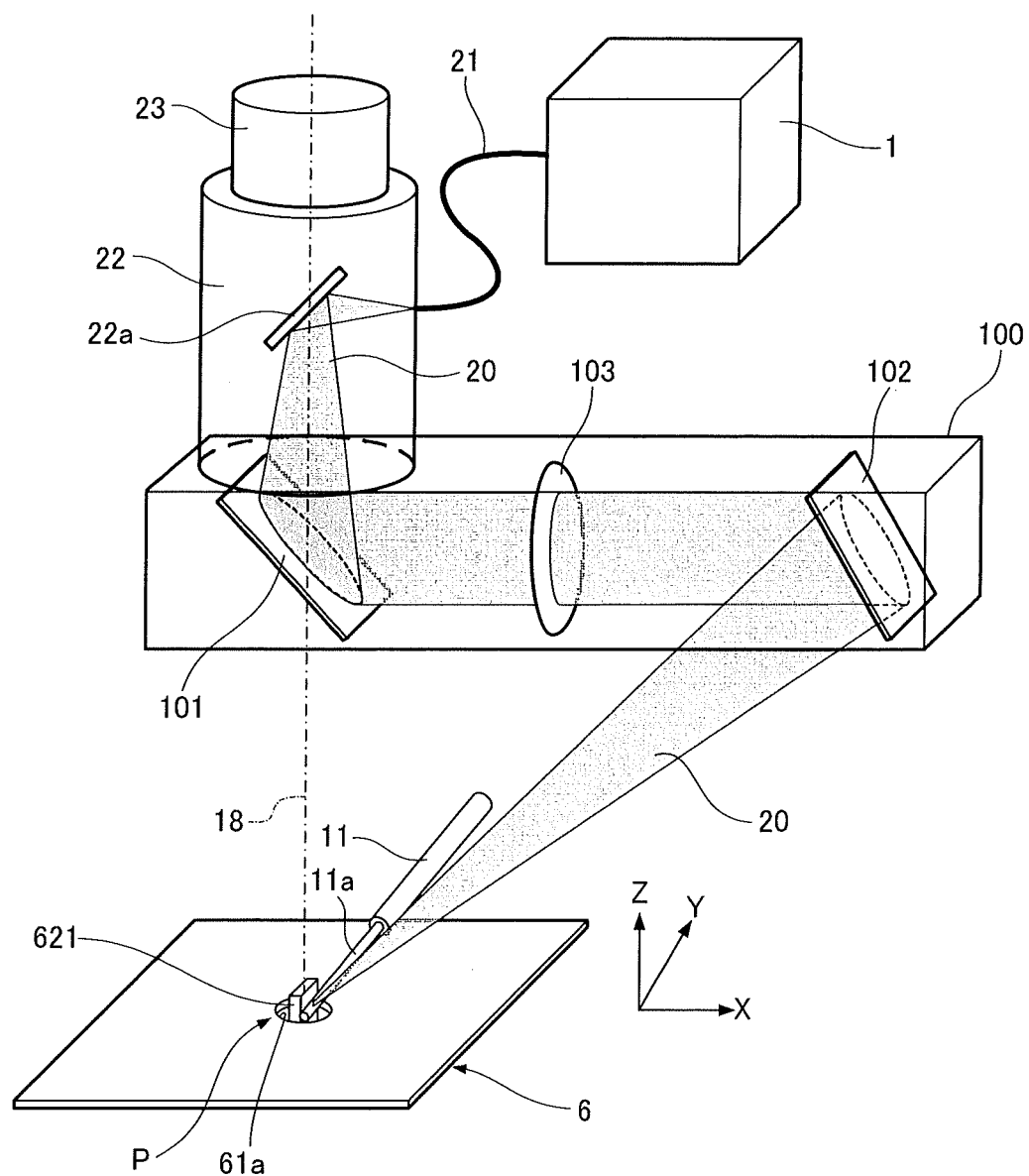
FIG. 2 is a perspective diagram of an optics system including a reflective optics unit as the main component according to the first embodiment.
Figure 3:
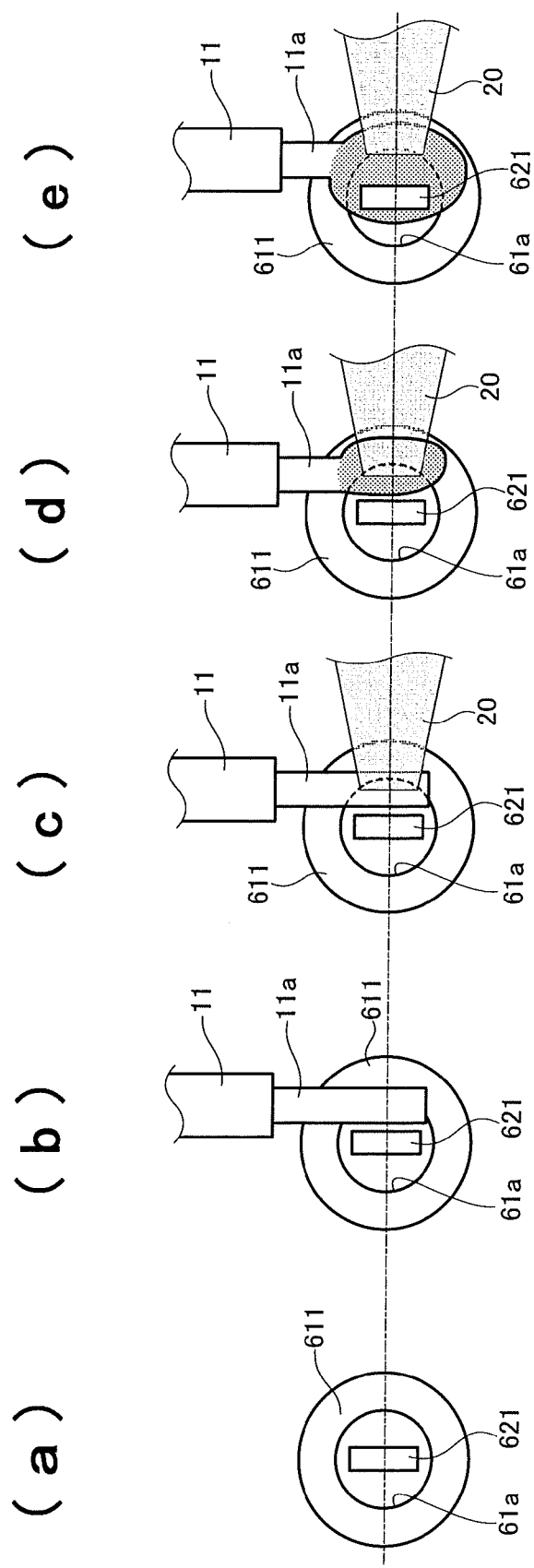
FIGS. 3a-e are schematic diagrams showing a soldering process according to the first embodiment.
Figure 4:
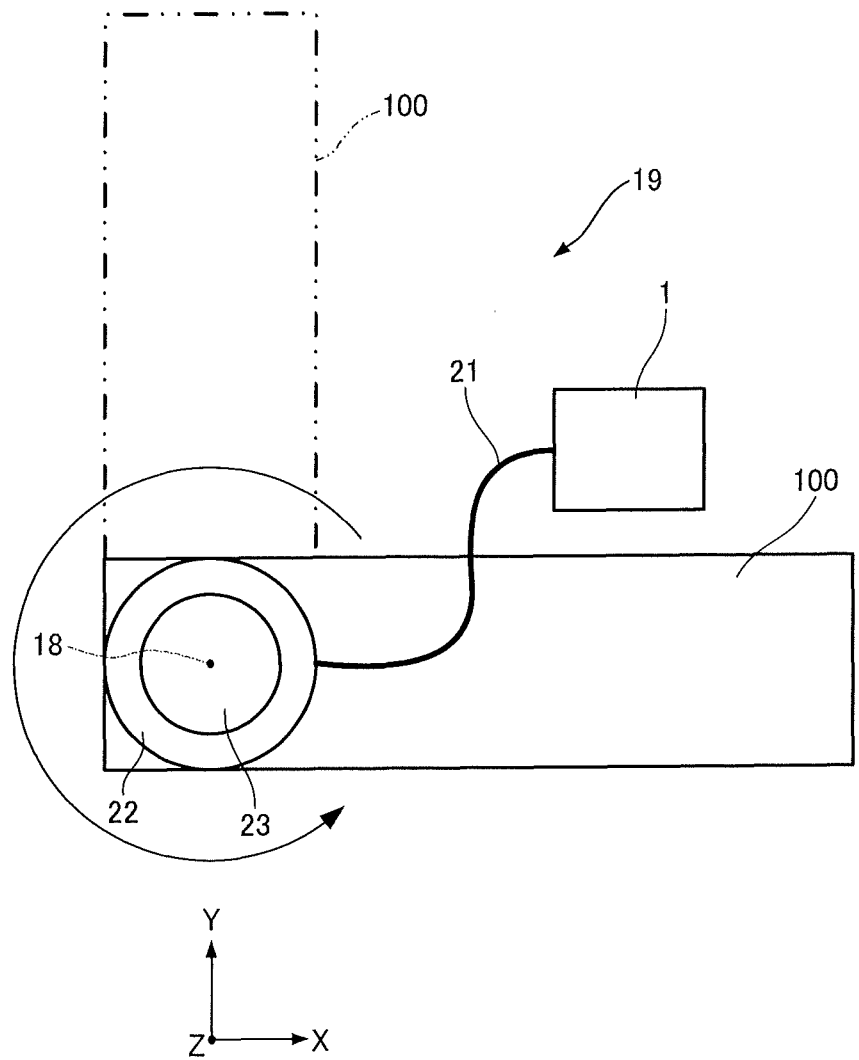
FIG. 4 is a plan view showing the operating conditions of the reflective optics unit according to the first embodiment.
Figure 5:
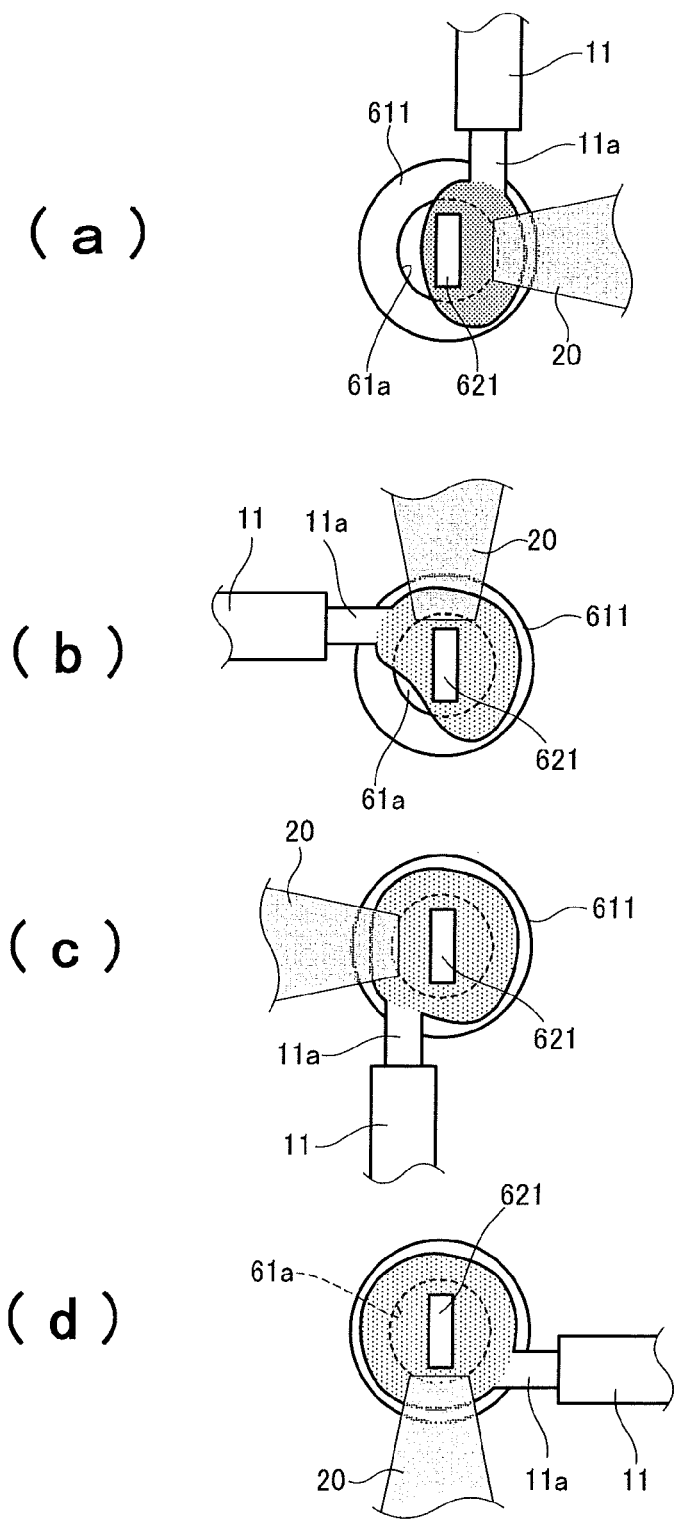
FIGS. 5a-d show schematic diagrams of a change in the direction of laser irradiation due to the rotation of the reflective optics unit according to the first embodiment.

A processing head 16 for irradiating the laser light 20 includes a mirror tube 22 having a half mirror 22a provided therein, a half mirror 101 acting as a first mirror and a mirror 102 acting as a second mirror, and an optics unit 100 having a condensing lens 103 disposed between the half mirror 101 and the mirror 102, the condensing lens 103 serving as an optic system for condensing the laser light. As shown in FIG. 2, the optics unit 100 is coupled so as to rotate about a central axis 18 of the mirror tube 22 with the side where the half mirror 101 is disposed as the base end thereof. An axis linking the soldering point P with the optical axis of the laser light incident on the half mirror 101 coincides with the central axis 18 of the mirror tube 22. FIG. 4 shows a rotation drive device 19 for driving and rotating the optics unit 100 with respect to the mirror tube 22.

The mirror tube 22 is attached to a drive device 10 via a first movement device 12. The processing head 16 can be moved to the soldering point P by operating the drive device 10. The processing head 16 can be moved in the upward/downward direction (Z axis direction) with respect to the substrate 6 by means of the first movement device 12.

The solder supply unit 11 is attached to the mirror tube 22 via a second movement device 13 and a third movement device 14, and rotates about the central axis 18 of the mirror tube 22 together with the optics unit 100. The second movement device 13 can move the solder supply unit 11 in the upward/downward direction (Z axis direction) with respect to the substrate 6. The third movement device 14 moves the solder supply unit 11 horizontally so as to locate an appropriate supply position of the solder 11a.

Laser light is supplied from a light source 1 to the mirror tube 22 via an optical fiber 21. The light emitted from the output end of the optical fiber 21 is reflected via the half mirror 22a, and is irradiated onto the half mirror 101 of the optics unit 100 from the mirror tube 22. The light reflected by the half mirror 101 is condensed by the condensing lens 103, irradiated onto the mirror 102 and then irradiated onto the soldering point P.

The threadlike solder 11a is supplied to the soldering point P from the solder supply unit 11 as shown in FIG. 3B to FIG. 3E. The threadlike solder 11a is solder having a flux filling layer of 0.3 mm to 3.0 mm in diameter therein.

FIG. 3A shows a state before soldering. In this state, the flat insertion pin 621 serving as the lead of the component 62 is inserted into the through hole land 611 of the insertion hole 61a on the substrate 6 from the component mounting surface 17 of the substrate 6.

The solder supply unit 11 supplies the solder 11a to a position traversing a gap between the through hole land 611 and the insertion pin 621 as shown in FIG. 3B, and halts the feed of the solder 11a.

The laser light 20 reflected by the mirror 102 and irradiated onto the soldering point P is irradiated obliquely onto the solder 11a which traverses the position of the insertion hole 61a, as shown in FIG. 3C. In this way, since the laser light 20 is irradiated obliquely and the solder 11a is supplied between the insertion hole 61a and the irradiation position of the laser light 20, then the laser light 20 is blocked by the solder 11a and thus the laser light 20 is not transmitted to the component mounting surface 17 on the substrate 6 via the insertion hole 61a, or alternatively, the laser light 20 transmitted to the component mounting surface 17 via the insertion hole 61a is reduced, and a portion of the component 62 on the side of the component mounting surface 17 does not exceed the heat resistance limit.

The size of a gap when the component 62 is inserted into the insertion hole 61a opened in the substrate 6 is in the range of 0.2 mm to 2.0 mm, and if a substrate 6 having a thickness of 0.5 mm to 1.0 mm is used, then the angle formed between the optical axis direction and the normal to the substrate 6 so as to prevent the laser light 20 from being transmitted through the gap onto the component mounting surface 17 is between 11° and 76°. The irradiation angle of the laser light 20 is altered by changing the elevation angle of the mirror 102.

As shown in FIG. 3D, the supply of the solder 11a from the solder supply unit 11 is halted until the front tip of the solder 11a is heated by the irradiation of the laser light 20 and starts to melt. As shown in FIG. 3E, at the timing when the front tip of the solder 11a starts to melt, the supply of the solder 11a from the solder supply unit 11 is restarted and continues until a required amount of the solder has been supplied.

A portion between the through hole land 611 and the insertion pin 621 is wetted by the molten solder, as shown in FIG. 3E, and when the molten solder is subsequently solidified, the soldering is completed.

Depending on the state of insertion of the component 62 into the insertion hole 61a, the insertion pin 621 in the insertion hole 61a may be inclined as shown in FIG. 5A, regardless of the positional relationship shown in FIG. 3E. In this case, the optics unit 100 and the solder supply unit 11 are driven by the rotation drive device 19 to rotate in accordance with the insertion pin 621, as indicated by the virtual line in FIG. 4, about the axis linking the soldering point P and the optical axis of the laser light incident on the half mirror 101, and thus soldering of favorable quality can be achieved regardless of the insertion pin 621 in the insertion hole 61a. Moreover, even in a case where the insertion pin 621 in the insertion hole 61a is in the positional relationship shown in FIG. 3E, if there is a member obstructive to the soldering operation on the periphery thereof, then as shown in FIG. 5B, soldering of favorable quality can be achieved by changing the optics unit 100 and the solder supply unit 11 through 180° by means of the rotation drive device 19.

A camera 23 is disposed above the mirror tube 22 in such a manner that the mirror tube 22 and the optical axis are coaxial. A coating which transmits the sensitivity waveband of the camera 23 and reflects only the wavelength of the laser light 20 is applied on the half mirror 101, and the component 62 at the soldering point P can be observed from the direction of the normal to the substrate 6 by means of the light transmitted through the half mirror 22a and the half mirror 101.

In this way, by irradiating the laser light 20 obliquely onto the soldering point P, it is possible to reduce the amount of the laser light 20 passing through the insertion hole 61a, thereby preventing damage to the low-heat-resistance portion of the component 62 disposed on the rear surface side of the substrate 6.

An image through the insertion hole 61a cannot be observed from the same oblique direction as the laser light 20 by means of a camera or the like, but in the present embodiment, since it is possible to observe the substrate 6 from the normal direction by means of the camera 23, then the low-heat-resistance portion of the component 62 made of resin can be observed through the gap between the insertion hole 61a and the lead wire of the component 62. Therefore, it is possible to judge whether or not damage has been caused.

Furthermore, by making an observation from the normal direction to the substrate 6 with the camera 23, the state of the lower face of a printed circuit substrate 61 is observed when there is insufficient supply of solder, and thus it is possible to judge defects, or to observe the state of the solder drawn to the opposite side of the printed circuit substrate 61 from a side where the laser light is irradiated.

Figure 10:
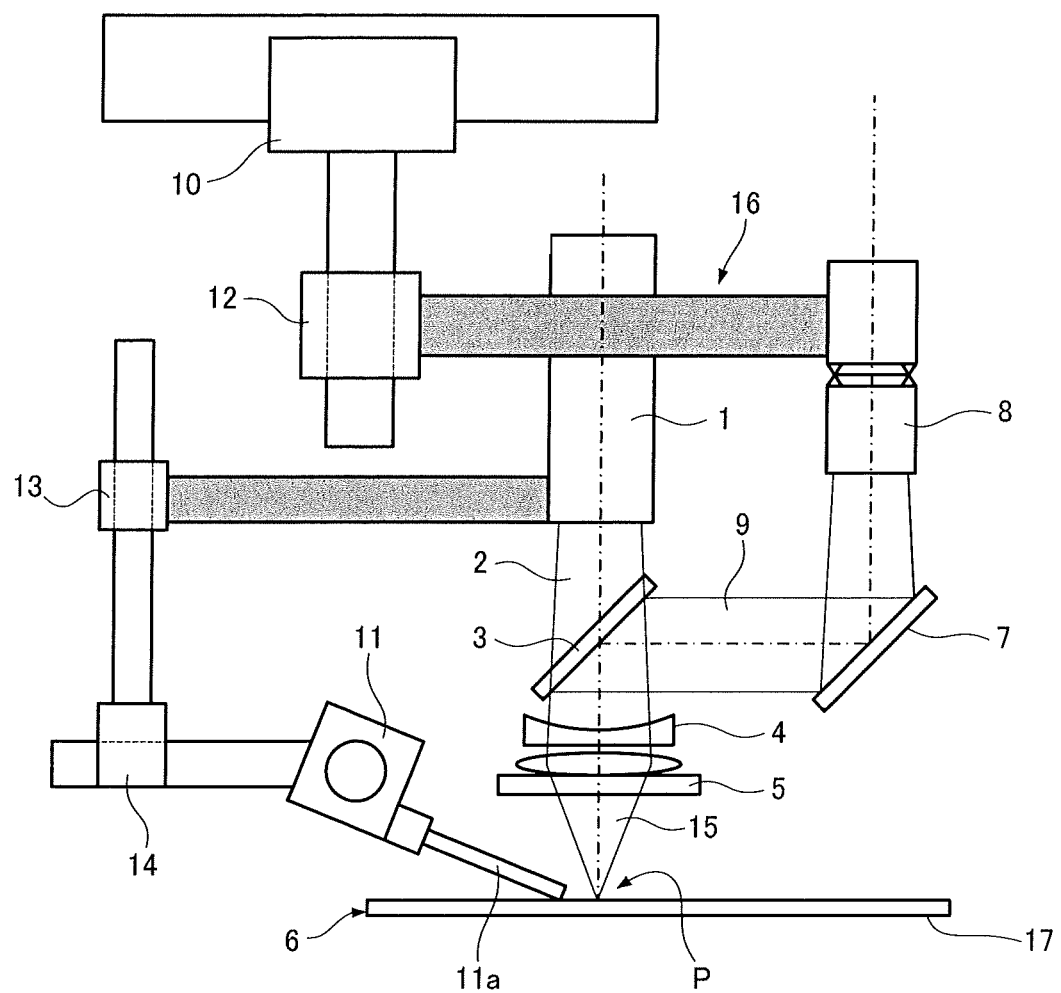
FIG. 10 is a configurational diagram of a conventional laser soldering apparatus.

In this embodiment, by rotating the reflective optics unit 100, it is possible to irradiate the laser light 20 from an optimal direction onto a variety of substrates 6. In the case of the composition shown in FIG. 10, which is a prior art example, if irradiation from an oblique direction and rotation are to be performed, then almost all of the constituent elements have to be inclined and rotated, and therefore an extremely large drive mechanism is required, whereas in the present embodiment, this can be achieved simply by rotating the reflective optics unit 100 and the solder supply unit 11.

Further, it is conceivable that the camera 23 is disposed independently in the normal direction to the substrate 6 and the mirror tube 22 which emits the laser light 20 is arranged obliquely. However, if a composition of this kind is adopted, since the mirror tube 22 is coupled to a power cable or an optical fiber cable, these cables need to be handled when the mirror tube 22 is rotated. On the other hand, in the case of the composition according to the present embodiment, a compact composition is achieved only by rotating the reflective optics unit 100.

Moreover, since the image from the camera 23 is not rotated, then it is possible to confirm the direction of irradiation of the laser light 20 on the same screen.

In this embodiment, the component 62 having low heat resistance is made of resin, but the invention is effective in the case of using another material below ordinary solder having a melting, point of (approximately 220° C.) in heat resistance.

(Second Embodiment)

Figure 6:
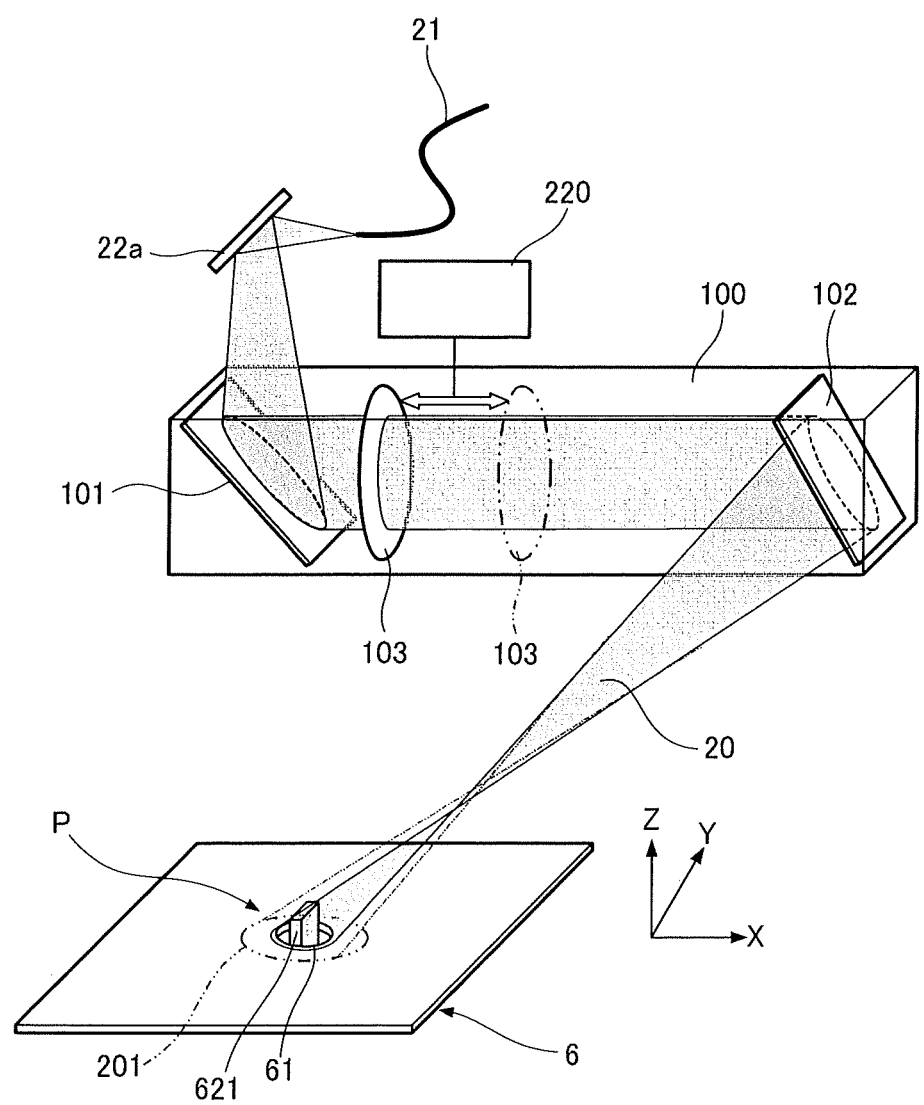
FIG. 6 is a perspective diagram of a reflective optics unit according to a second embodiment of the present invention.

In the first embodiment, the position of the condensing lens 103 in the reflective optics unit 100 is fixed to a previously determined position, but in this second embodiment, as shown in FIG. 6, a lens drive device 220 is provided to move the condensing lens 103 in the optical axis direction, from the position indicated by the solid lines to the position indicated by the virtual lines inside the reflective optics unit 100. Apart from this, the embodiment is the same as the first embodiment.

With this composition, by changing the position of the condensing lens 103 on a case-by-case basis in accordance with the shapes of an insertion hole 61a at a soldering point P, a through hole land 611 and an insertion pin 621, it is possible to obtain a spot shape 201 of an optimal mode. More specifically, it is possible to change the size of the spot shape 201 of the laser light 20 irradiated onto the soldering point P while being kept in a circle. The spot shape 201 is enlarged as the condensing lens 103 moves away from the focal position. The spot shape 201 obtained at this point has a diameter of 0.5 mm to 10 mm, for example.

(Third Embodiment)

Figure 7:
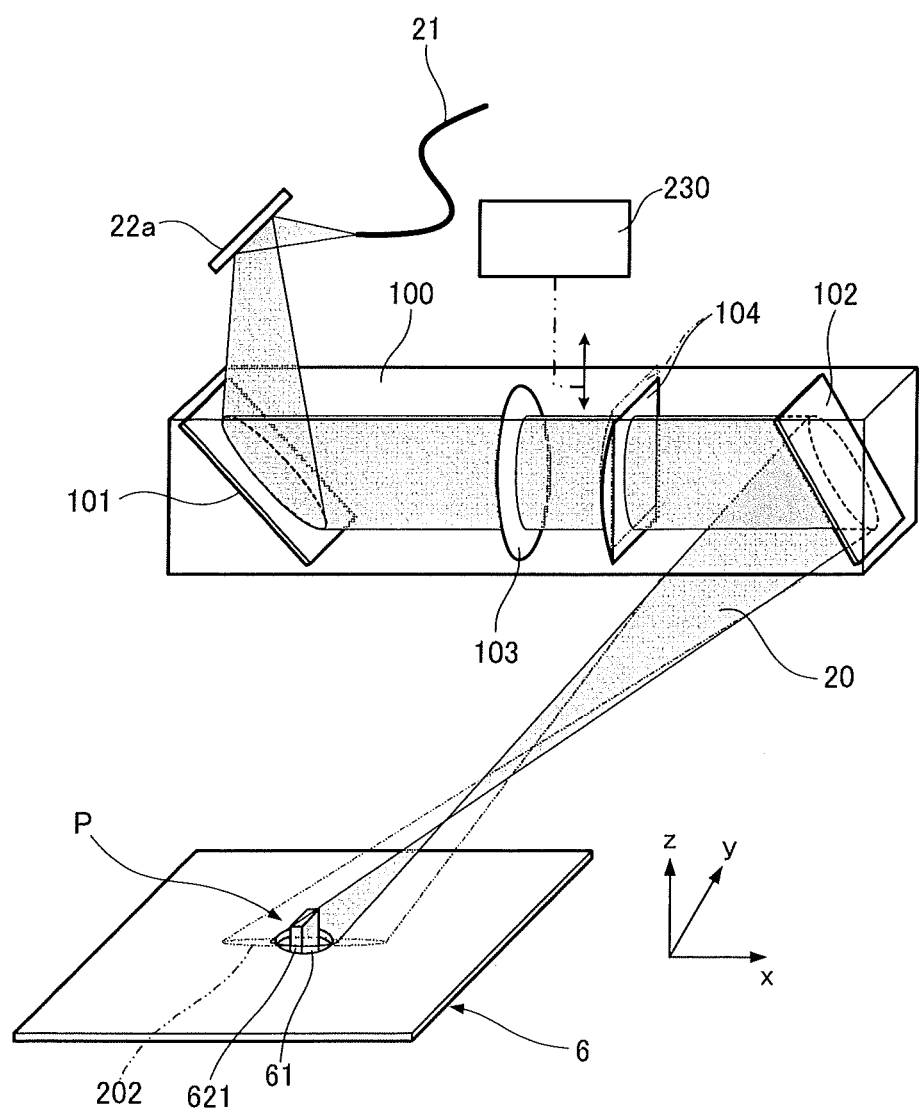
FIG. 7 is a perspective diagram of a reflective optics unit according to a third embodiment of the present invention.

In the first embodiment, the position of the condensing lens 103 in the reflective optics unit 100 is fixed to a predetermined position, but in this third embodiment, a lens lacking axial symmetry optically, for instance, a cylindrical lens 104, is further provided between a first mirror 101 and a second mirror 102 of the reflective optics unit 100, as shown in FIG. 7. The cylindrical lens 104 can be inserted into and removed from the optical axis of the reflective optics unit 100 by an insertion drive device 230. Other compositions in the embodiment are the same as in the first embodiment.

With this composition, a line-shaped spot shape 202 can be obtained and it is possible to perform continuous soldering (liner Soldering) on the pin portion of a straight line-shaped component 62 arranged on a substrate 6. The length in the lengthways direction of the line-shaped spot shape 202 obtained at this point is in the range of 1 mm to 15 mm, for example, and the widthways direction of the spot shape is in the range of 0.5 mm to 10 mm.

In FIG. 7, the cylindrical lens 104 is disposed at the rear of the condenser lens 103, but the cylindrical lens 104 may also be provided in front of the condenser lens 103. In other words, even when the cylindrical lens 104 is inserted into the optical axis between the condensing lens 103 and the half mirror 101, it is possible to change the shape of a condensed spot on the substrate 6 to the spot shape 202 enlarged in the X direction.

(Fourth Embodiment)

Figure 8:
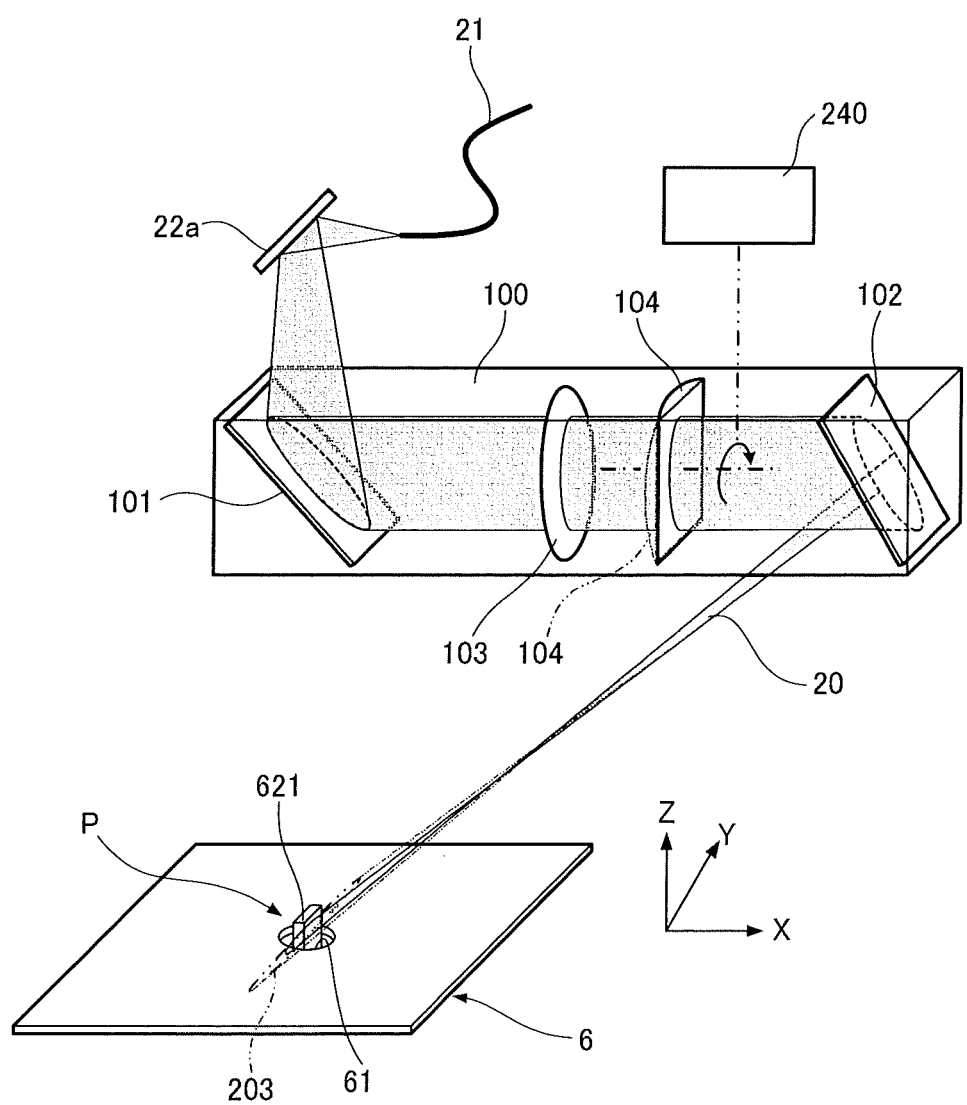
FIG. 8 is a perspective diagram of a reflective optics unit according to a fourth embodiment of the present invention.

In the third embodiment, the insertion drive device 230 is provided in such a manner that the cylindrical lens 104 is removed from and inserted into the optical axis of the reflective optics unit 100, but in this fourth embodiment, as shown in FIG. 8, a lens lacking axial symmetry optically, for instance, a cylindrical lens 104 is provided between a first mirror 101 and a second mirror 102 of the reflective optics unit 100, and the cylindrical lens 104 is rotatable about the center of the optical axis, by means of a lens rotation drive device 240. Other compositions in the embodiment are the same as in the first embodiment.

The position of the cylindrical lens 104 indicated by the solid lines in FIG. 8 is a composition in which the cylindrical lens 104 is rotated through 90° with respect to the composition shown in FIG. 7.

According to this composition, it is possible to make the spot shape of a laser light 20 on a substrate 6 a spot shape 203 enlarged in the Y direction. Although the angle of rotation of the cylindrical lens 104 is 90°, the lens does not necessarily have to be rotated through 90° and the angle of rotation may be set to any angle.

In this way, it is possible to set the orientation of the spot shape 203 of the laser light 20 on the substrate 6 to any angle on the substrate 6. When a soldering portion is arranged in a straight line shape on the substrate 6, then it is possible to adopt a liner Soldering process, whatever the angle of the soldering portion is.

In FIG. 8, the cylindrical lens 104 is arranged at the rear of the condensing lens 103, but the cylindrical lens may be arranged in front of the condensing lens 103. More specifically, by inserting the cylindrical lens 104 into the optical axis between the condensing lens 103 and the half mirror 101, the shape of a condensed spot on the substrate 6 may be changed to the spot shape 203 enlarged in the Y direction.

(Fifth Embodiment)

Figure 9:
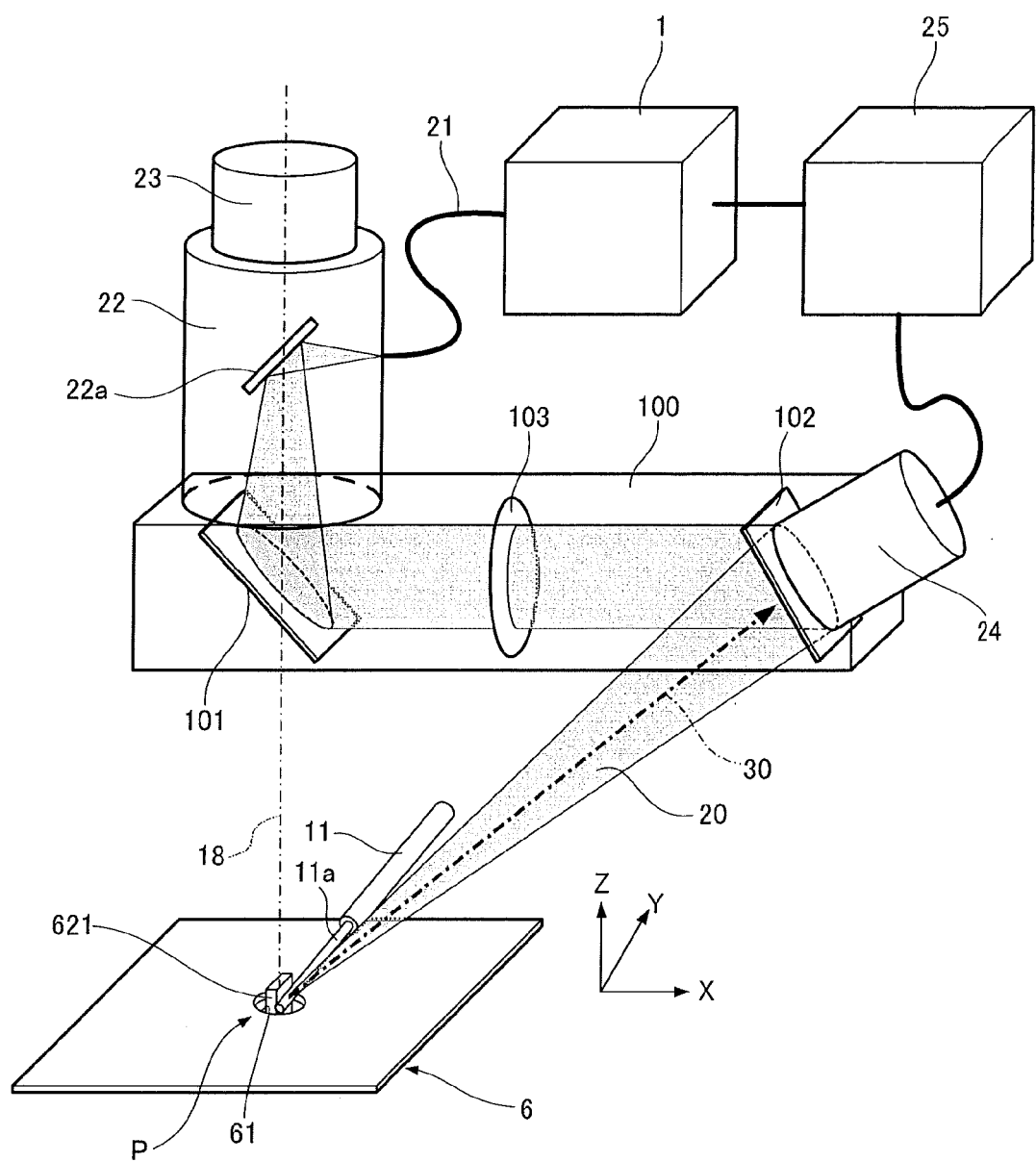
FIG. 9 is a perspective diagram of a reflective optics unit according to a fifth embodiment of the present invention.

The only difference in the fifth embodiment shown in FIG. 9 is that a temperature sensor 24 is provided in the mirror 102 of the first embodiment and a light source 1 is controlled on the basis of a temperature determined by the temperature sensor 24.

The mirror 102, for example, reflects the wavelength of a laser light 20 (800 nm to 1100 nm) and transmits the wavelength of infrared radiation light 30 (1300 nm to 2600 nm).

The temperature sensor 24 detects the infrared radiation light 30 radiated from a soldering point P during a soldering process on a substrate 6, and a calculation unit 25 calculates the temperature of the soldering point P. The light source 1 changes output on the basis of the calculation results of the calculation unit 25.

With this composition, through determining the temperature of the soldering point P on the substrate 6, it is possible to perform control to set suitable output of the laser light 20 by sending a command signal to the light source 1 if the temperature rises excessively. For example, by controlling the output of the laser light 20 in such a manner that the maximum temperature of the soldering point P is between 250° C. and 300° C., then it is possible to prevent soldering defects caused by insufficient wetting of solder at the soldering point P, as well as preventing oxidation or damage caused by excessive heat and the like. This can also be achieved in the second to fourth embodiments.

In the respective embodiments described above, the reflective optics unit 100 and the solder supply unit 11 are driven to rotate in unison, but it is also possible to synchronize the rotation of the reflective optics unit 100 and the solder supply unit 11, and to adopt a composition in which rotational drive devices are provided separately for the reflective optics unit 100 and the solder supply unit 11.

In the respective embodiments described above, the solder supply unit 11 is provided, but the solder supply unit 11 is not necessary in cases where, for instance, a solder paste is applied previously onto the soldering point P on the substrate 1.

The present invention can contribute to improving the reliability of solder mounting of electronic devices of various types which require compact processing having superior mass production characteristics.

What is claimed is:

1. A laser soldering apparatus for soldering a component onto a soldering point on a substrate using laser light, comprising:
a first mirror for reflecting the laser light emitted from a mirror tube in a direction intersecting with a central axis of the mirror tube;
a second mirror for receiving the laser light from the first mirror and reflecting the laser light to a soldering point;
an optics system for condensing the laser light, the optics system being disposed between the first mirror and the second mirror; and
a camera for observing the soldering point on the substrate, disposed on the central axis of the mirror tube,
wherein the apparatus is configured such that the laser light is irradiated from the second mirror onto the soldering point at an angle with respect to an axial direction of the mirror tube, and
the first mirror reflects the laser light from the mirror tube and transmits the light from the soldering point to the camera.

2. The laser soldering apparatus according to claim 1, wherein the angle of the irradiation of the laser light with respect to a vertical direction of the substrate at the soldering point is set to 11° to 76°.

3. The laser soldering apparatus according to claim 1, wherein solder is supplied from a solder supply unit to the soldering point so as to block the laser light irradiated from the second mirror.

4. The laser soldering apparatus according to claim 1, further comprising a rotational drive device for rotating an optics unit having the first mirror, the second mirror and the optics system about an axis linking the soldering point with an optical axis of the laser light incident on the first mirror.

5. The laser soldering apparatus according to claim 1, wherein the optics system is movably provided in an optical axis direction of the optics system, and a size of an irradiation spot of the laser light at the soldering point on the substrate can be changed.

6. The laser soldering apparatus according to claim 1, wherein a lens lacking axial symmetry optically is disposed before or behind the optics system on an optical axis thereof to change a shape of an irradiation spot of the laser light at the soldering point on the substrate to an elliptical or linear shape.

7. The laser soldering apparatus according to claim 1, further comprising an infrared radiation type temperature sensor for measuring a temperature of the soldering point, wherein laser output of a light source of the laser light is controlled on a basis of a measurement result by the temperature sensor.

8. The laser soldering apparatus according to claim 1, wherein the second mirror is covered with a coating for reflecting the laser light from a side of the first mirror and transmitting infrared rays necessary for temperature measurement, of the light reflected from the soldering point on the substrate, a temperature sensor is provided on a rear surface of the second mirror, and laser output of a light source of the laser light is controlled on a basis of a measurement result by the temperature sensor.

* * * * *